United States Patent
Ahmed et al.

(10) Patent No.: US 8,790,956 B2
(45) Date of Patent: Jul. 29, 2014

(54) STRUCTURE AND METHOD OF FABRICATING A CZTS PHOTOVOLTAIC DEVICE BY ELECTRODEPOSITION

(71) Applicant: International Business Machines Corporation, Armonk, NY (US)

(72) Inventors: Shafaat Ahmed, Yorktown Heights, NY (US); Hariklia Deligianni, Tenafly, NJ (US); Lubomyr T. Romankiw, Briarcliff Manor, NY (US); Kejia Wang, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/712,225

(22) Filed: Dec. 12, 2012

(65) Prior Publication Data
US 2013/0125977 A1    May 23, 2013

Related U.S. Application Data

(62) Division of application No. 12/878,746, filed on Sep. 9, 2010, now Pat. No. 8,426,241.

(51) Int. Cl.
*H01L 31/0272* (2006.01)

(52) U.S. Cl.
CPC ... *H01L 31/0272* (2013.01); *H01L 2924/10822* (2013.01)
USPC ..................................... 438/84; 257/E31.008

(58) Field of Classification Search
CPC .............. H01L 31/0272; H01L 31/032; H01L 2924/10822
USPC .................. 257/459, 762, E31.004, E31.008; 438/98, 84
See application file for complete search history.

(56) References Cited

U.S. PATENT DOCUMENTS

| 4,581,108 A | * | 4/1986 | Kapur et al. ................. 205/170 |
| 5,312,532 A | | 5/1994 | Andricacos et al. |

(Continued)

FOREIGN PATENT DOCUMENTS

| GB | 1465169 | 2/1977 |
| WO | WO2010006623 A2 | 1/2010 |

OTHER PUBLICATIONS

Hideaki Araki et al, "Preparation of Cu2ZnSnS4 Thin Films by Sulfurizing Electroplated Precursors," Solar Energy Materials & Solar Cells, 93, 996-999 (2009)—Published Jan. 21, 2009.

(Continued)

*Primary Examiner* — Allan R Wilson
(74) *Attorney, Agent, or Firm* — Vazken Alexanian; Michael J. Chang, LLC

(57) ABSTRACT

Techniques for using electrodeposition to form absorber layers in diodes (e.g., solar cells) are provided. In one aspect, a method for fabricating a diode is provided. The method includes the following steps. A substrate is provided. A backside electrode is formed on the substrate. One or more layers are electrodeposited on the backside electrode, wherein at least one of the layers comprises copper, at least one of the layers comprises zinc and at least one of the layers comprises tin. The layers are annealed in an environment containing a sulfur source to form a p-type CZTS absorber layer on the backside electrode. An n-type semiconductor layer is formed on the CZTS absorber layer. A transparent conductive layer is formed on the n-type semiconductor layer. A diode is also provided.

11 Claims, 10 Drawing Sheets

(56) References Cited

U.S. PATENT DOCUMENTS

| | | | |
|---|---|---|---|
| 5,516,412 | A | 5/1996 | Andricacos et al. |
| 6,475,640 | B1 | 11/2002 | Doujak et al. |
| 6,653,701 | B1 | 11/2003 | Yamazaki et al. |
| 2006/0137991 | A1 | 6/2006 | Zschintzsch et al. |
| 2006/0260948 | A2 | 11/2006 | Zschintzsch et al. |
| 2009/0205714 | A1 | 8/2009 | Kuhnlein et al. |
| 2009/0321268 | A1 | 12/2009 | Nakashima et al. |
| 2010/0186805 | A1 | 7/2010 | Krunks et al. |
| 2011/0030785 | A1* | 2/2011 | Fujdala et al. ............... 136/258 |
| 2011/0048493 | A1 | 3/2011 | Yun et al. |
| 2011/0092010 | A1 | 4/2011 | Van Duren et al. |
| 2011/0094557 | A1 | 4/2011 | Mitzi et al. |
| 2011/0232758 | A1 | 9/2011 | Khanarian et al. |
| 2011/0294254 | A1 | 12/2011 | Jackrel et al. |
| 2011/0308579 | A1 | 12/2011 | Yun |
| 2012/0060928 | A1 | 3/2012 | Johnson et al. |
| 2012/0061628 | A1 | 3/2012 | Johnson et al. |
| 2012/0279565 | A1* | 11/2012 | Mitzi et al. ................... 136/256 |
| 2012/0313200 | A1* | 12/2012 | Jackrel et al. ................. 257/431 |
| 2013/0037106 | A1* | 2/2013 | Fujdala et al. ............... 136/258 |
| 2013/0125988 | A1* | 5/2013 | Cao et al. .................... 136/264 |

OTHER PUBLICATIONS

A. Ennaoui et al., "Cu2ZnSnS4 Thin Film Solar Cells from Electroplated Precursors: Novel Low-Cost Perspective," Thin Solid films 517, 2511-2514 (2009)—Published Nov. 14, 2008.

Masato Kurihara et al., "Kesterite Absorber Layer Uniformity From Electrodeposited Pre-Cursors," Phys. Status. Solidi C 6, No. 5, 1241-1244 (2009)—Published Mar. 12, 2009.

P.M.P. Salome et al., "Influence of Selenization Pressure on the Growth of Cu2ZnSnSe4 Films From Stacked Metallic Layers," Phys. Status. Solidi C 7, No. 3-4, 913-916 (2010)—Published Jan. 25, 2010.

Jonathan J. Scragg et al., "New Routes to Sustainable Photovoltaics: Evaluation of Cu2ZnSnS4 as an Alternative Absorber Material," Phys. Status. Solidi (b) 245, No. 9, 1772-1778 (2008)—Published Jul. 23, 2008.

* cited by examiner

1200

GLASS/Mo/Cu/Sn/Zn

1300

1400
SPECTRUM

1500

INTERMEDIATE ANNEALING RAMPS NEED
TO FOLLOW TO AVOID BALLING OF TIN

1600

1900

2000

STRUCTURE AND METHOD OF FABRICATING A CZTS PHOTOVOLTAIC DEVICE BY ELECTRODEPOSITION

CROSS-REFERENCE TO RELATED APPLICATION(S)

This application is a divisional of U.S. application Ser. No. 12/878,746 filed on Sep. 9, 2010, now U.S. Pat. No. 8,426,241, the disclosure of which is incorporated by reference herein.

FIELD OF THE INVENTION

The present invention relates to electrodeposition fabrication processes and more particularly, to techniques for using electrodeposition to form absorber layers in diodes (e.g., solar cells).

BACKGROUND OF THE INVENTION

Low-cost, earth abundant materials, such as $Cu_2ZnSn(S,Se)_4$ (CZTS), have been developed as an alternative to higher cost, less available copper indium gallium selenide (CIGS) absorber materials for next generation thin film photovoltaic devices. CZTS is one of the most promising materials for fabricating low-cost thin film solar cells. CZTS consists of earth abundant materials like copper (Cu), zinc (Zn) and tin (Sn) and has band gap energy of from 1.4 electron volt (eV) to 1.5 eV and an absorption co-efficient of $10^4$ $cm^{-1}$. See, for example, Hideaki Araki et al, "Preparation of $Cu_2ZnSnS_4$ Thin Films by Sulfurizing Electroplated Precursors," Solar Energy Materials & Solar Cells, 93, 996-999 (2009), P. M. P Salome et al., "Influence of Selenization Pressure on the Growth of $Cu_2ZnSnSe_4$ Films From Stacked Metallic Layers," Phys. Status. Solidi C 7, no. 3-4, 913-916 (2010), Masato Kurihara et al., "Kesterite Absorber Layer Uniformity From Electrodeposited Pre-Cursors," Phys. Status. Solidi C 6, no. 5, 1241-1244 (2009), Jonathan J. Scragg et al., "New Routes to Sustainable Photovoltaics: Evaluation of $Cu_2ZnSnS_4$ as an Alternative Absorber Material," Phys. Status. Solidi (b) 245, no. 9, 1772-1778 (2008), A. Ennaoui et al., "Cu2ZnSnS4 Thin Film Solar Cells from Electroplated Precursors Novel Low-Cost Perspective," Thin Solid films 517, 2511-2514 (2009) and U.S. Patent Application No. 20090205714 filed by Kuhnlein et al., entitled "Metal Plating Composition and Method for the Deposition of Copper-Zinc-Tin Suitable for Manufacturing Thin Film Solar Cell."

Vacuum deposition processes are typically used to form CZTS absorber layers in photovoltaic devices. Vacuum deposition is however costly. Further, with vacuum deposition it is difficult to deposit the material over large areas uniformly.

Therefore, improved techniques for forming CZTS absorber layers in photovoltaic device applications would be desirable.

SUMMARY OF THE INVENTION

The present invention provides techniques for using electrodeposition to form absorber layers in diodes (e.g., solar cells). In one aspect of the invention, a method for fabricating a diode is provided. The method includes the following steps. A substrate is provided. A backside electrode is formed on the substrate. One or more layers are electrodeposited on the backside electrode, wherein at least one of the layers comprises copper, at least one of the layers comprises zinc and at least one of the layers comprises tin. The layers are annealed in an environment containing a sulfur source to form a p-type CZTS absorber layer on the backside electrode. An n-type semiconductor layer is formed on the CZTS absorber layer. A transparent conductive layer is formed on the n-type semiconductor layer.

In another aspect of the invention, a diode is provided. The diode includes a substrate; a backside electrode on the substrate; a CZTS absorber layer electrodeposited on the backside electrode, wherein the CZTS absorber layer comprises copper, zinc and tin, and wherein a compositional ratio of copper to tin is from about 1.5 to about 2.2, a compositional ratio of zinc to tin is from about 1.2 to about 1.4 and a compositional ratio of copper to zinc and tin is from about 0.5 to about 0.95; an n-type semiconductor layer on the CZTS absorber layer; a transparent conductive layer on the n-type semiconductor layer; and a metal grid electrode on the transparent conductive layer.

A more complete understanding of the present invention, as well as further features and advantages of the present invention, will be obtained by reference to the following detailed description and drawings.

DETAILED DESCRIPTION OF PREFERRED EMBODIMENTS

Provided herein is an electrodeposition process for the fabrication of $Cu_2ZnSn(S,Se)_4$ (CZTS) p-type absorber materials for solar cell applications. Electrodeposition is much cheaper than any vacuum process and allows the fabrication of large areas with excellent thickness uniformity and compositional uniformity.

FIGS. 1-10 are cross-sectional diagrams illustrating an exemplary methodology for fabricating a diode, e.g., a solar cell. To begin the fabrication process, a substrate 101 is provided. Suitable substrates include, but are not limited to, glass, metal, metal foil, stainless steel and copper (Cu) foil substrates. A backside electrode 102 is then formed on the substrate. Suitable materials for forming the backside electrode include, but are not limited to, molybdenum (Mo), Cu and titanium (Ti). The backside electrode material may be deposited on the substrate using a physical vapor deposition (PVD) method. A metal (e.g., Cu) layer (not shown) may be present on the backside electrode. A conductor layer is needed in order to electroplate the absorber layer on the substrate (see below). In this example, the metal (e.g., Cu) layer serves this purpose. Further, the metal (e.g., Cu) layer prevents the undesirable oxidation of the Mo. According to an exemplary embodiment, the backside electrode-substrate is a Mo-coated glass substrate. See, for example, FIG. 1. Prior to the formation of the backside electrode, the substrate may be smoothed. Further, a barrier layer (not shown) may be placed between the substrate and the backside electrode. According to an exemplary embodiment, the barrier layer includes a second metal, such as chrome and titanium nitride. If the substrate is glass coated with Mo and a metal (e.g., Cu) layer as described above, then smoothing and a barrier layer are not needed. On the other hand, if the substrate is for example, stainless steel, then a barrier layer is needed between the stainless steel substrate and the Mo to prevent the diffusion of iron (Fe) to the absorber layer. This is because Fe has a detrimental effect on the cell efficiency. In this example, the configuration would be the stainless steel substrate, the barrier layer on the substrate, Mo on a side of the barrier layer opposite the substrate and the metal (e.g., Cu) layer on a side of the Mo layer opposite the barrier layer.

Figure 1:
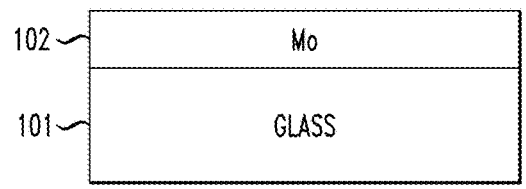
FIG. 1 is a cross-sectional diagram illustrating a molybdenum (Mo)-coated glass substrate according to an embodiment of the present invention.
Figure 2:
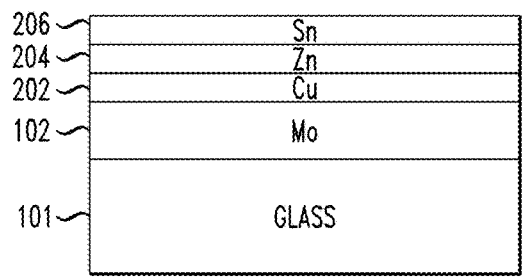
FIG. 2 is a cross-sectional diagram illustrating a metal stack having been electrodeposited on the substrate according to an embodiment of the present invention.

Next an absorber layer is formed on the substrate. In this example, the absorber layer is made of a CZTS p-type absorber material. According to the present techniques, the CZTS absorber layer can be fabricated in a number of different ways. Each of FIGS. 2-7 illustrate a different method for forming the CZTS absorber layer. For example, as shown in FIG. 2, a first way to fabricate the CZTS absorber layer is to electrodeposit (electroplate) a metal stack on the substrate. Specifically, a Cu metal layer 202 is electrodeposited on substrate 101 (i.e., on the backside electrode), for example, using a commercially available electroplating solution. A zinc (Zn) metal layer 204 is then electrodeposited onto Cu metal layer 202. According to an exemplary embodiment, Zn metal layer 204 is electrodeposited from a plating bath prepared using the techniques described in U.S. patent application Ser. No. 12/878,787, entitled "Zinc Thin Films Plating Chemistry and Methods" (hereinafter "U.S. patent application Ser. No. 12/878,787"), the contents of which are incorporated by reference herein. By way of example only, in U.S. patent application Ser. No. 12/878,787 a zinc electroplating solution is prepared by forming the solution from a mixture containing at least one zinc salt, a sulfonic acid, such as methanesulfonic acid (MSA), and a solvent. The sulfonic acid is quenched with a base. The pH of the solution is then adjusted to be either less than about 3.5 (e.g., with additional sulfonic acid) or greater than about 8.0 (e.g., with a second base). As described in U.S. patent application Ser. No. 12/878,787, the electroplating solution may further contain one or more additives such as organic additives (e.g., thiourea and thiazine and/or benzotriazole (BTA)), metalloid halides (e.g., bismuth chloride ($BiCl_3$), titanium chloride ($TiCl_3$), antimony trichloride ($SbCl_3$) and/or arsenic trichloride ($AsCl_3$)), one or more sources of $Cl^-$ ions (e.g., hydrochloric acid (HCl), potassium chloride (KCl) and/or sodium chloride (NaCl)) and/or one or more metalloid oxides (e.g., bismuth trioxide ($Bi_2O_3$), bismuth pentoxide ($Bi_2O_5$), antimony trioxide ($Sb_2O_3$), antimony pentoxide ($Sb_2O_5$), manganese dioxide ($MnO_2$) and/or manganese oxide (MnO)). Thus, Zn metal layer 204 (and any of the other Zn-containing films described herein that are plated from such a solution) can also contain one or more of these additives. By way of example only, Zn metal layer 204 may contain bismuth, i.e., $BiCl_3$, $Bi_2O_3$ and/or $Bi_2O_5$, as an additive.

A tin (Sn) metal layer 206 is then electrodeposited onto Zn metal layer 204, for example, using a commercially available electroplating solution. The component layers of the metal stack may be electrodeposited using a paddle cell, as described in detail below.

Alternatively, the order of deposition of the Zn metal layer and the Sn metal layer can be switched, i.e., the Sn metal layer can be deposited on the Cu metal layer and the Zn metal layer deposited on the Sn layer. The order shown in FIG. 2 is however preferred because the diffusion rate of Sn is faster than the diffusion rate of Zn and Cu. Furthermore, the diffusion rate of Zn is faster than the diffusion rate of Cu. So if Zn diffused downward into the Cu it will leave some voids in its middle layer whereas the faster diffusion of Sn into the Zn layer will eliminate these voids. These voids are generated due to the Kirkendall effect. Indeed the voids will develop in the Sn due to its fastest diffusion, but will be eliminated during annealing due to the highest mobility of Sn. Whichever order is chosen, it is important that the Cu metal (or alloy) layer be the first deposited on the substrate, otherwise voids will likely form. See below.

As will be described in detail below, the metal stack will be (preferably) subjected to an intermediate/soft anneal which will help to form the copper zinc tin (Cu—Zn—Sn) alloy followed by a final anneal in a sulfur (S) environment (to produce CZTS in the form of $Cu_2ZnSnS_4$) or in a S/selenium (Se) environment (to produce a single phase CZTS in the form of $Cu_2ZnSn(S/Se)_4$). Both of these forms of CZTS are very good p-type absorber layers and can be used for photovoltaic applications. While beneficial, the soft anneal is not required. However, if the structure is not subjected to a soft annealing, most likely the other unwanted secondary phase for example $Cu_2(S/Se)$ $Cu_{2-X}(S/Se)$, $Sn(S/Se)_2$, $Sn_2(S/Se)_3$, $Cu_2Sn(S/Se)_3$, $Zn(S/Se)$, etc. may form along with single phase polycrystalline CZTS which eventually will have adverse effects on the efficiency of the cell.

Further, in the embodiments that include Se in the stack, there is an additional anneal that is performed after each Se-containing layer is deposited. This step will also be described in detail below.

Figure 3:
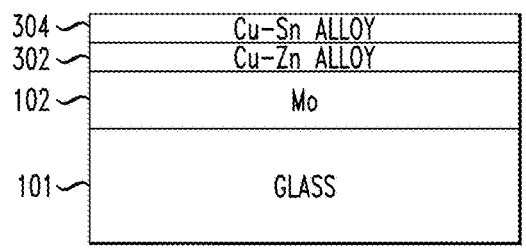
FIG. 3 is a cross-sectional diagram illustrating an alloy stack having been electrodeposited on the substrate according to an embodiment of the present invention.

As shown in FIG. 3, another way to fabricate the CZTS absorber layer is to electrodeposit an alloy stack on the substrate. Specifically, a copper zinc (Cu—Zn) alloy layer 302 is electrodeposited on substrate 101 (i.e., on the backside electrode). Techniques for preparing a Zn alloy plating bath, for example for plating a Cu—Zn alloy, are described in U.S. patent application Ser. No. 12/878,787. A copper tin (Cu—Sn) alloy layer 304 is then electrodeposited onto Cu—Zn alloy layer 302, for example, using a commercially available electroplating solution. The component layers of the alloy stack may be electrodeposited using a paddle cell, as described in detail below.

As will be described in detail below, the alloy stack will be (preferably) subjected to an intermediate/soft anneal which will help to form the Cu—Zn and Cu—Sn alloy followed by a final anneal in a S environment (to produce CZTS in the form of $Cu_2ZnSnS_4$) or in a S/Se environment (to produce CZTS in the form of $Cu_2ZnSn(S/Se)_4$). While beneficial, the soft anneal is not required. However, if the structure is not subjected to a soft annealing, most likely the other unwanted secondary phase for example $Cu_2(S/Se)$ $Cu_{2-X}(S/Se)$, $Sn(S/Se)_2$, $Sn_2(S/Se)_3$, $Cu_2Sn(S/Se)_3$, $Zn(S/Se)$, etc. may form along with single phase polycrystalline CZTS which eventually will have adverse effects on the efficiency of the cell.

Figure 4:
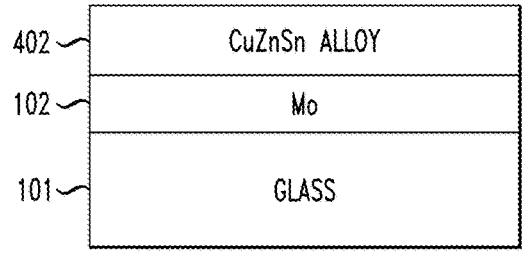
FIG. 4 is a cross-sectional diagram illustrating another exemplary embodiment wherein an alloy stack has been electrodeposited on the substrate according to an embodiment of the present invention.

Another method that involves electrodepositing an alloy stack on the substrate is shown in FIG. 4. Specifically, a Cu—Zn—Sn layer 402 is electrodeposited on substrate 101 (i.e., on the backside electrode). Techniques for preparing a Zn alloy plating bath, for example for plating a Cu—Zn—Sn alloy, are described in U.S. patent application Ser. No. 12/878,787. The alloy layer may be electrodeposited using a paddle cell, as described in detail below.

As will be described in detail below, the alloy stack will be (preferably) subjected to an intermediate/soft anneal which will help to form the Cu—Zn—Sn alloy followed by a final anneal in a S environment (to produce CZTS in the form of $Cu_2ZnSnS_4$) or in a S/Se environment (to produce CZTS in the form of $Cu_2ZnSn(S/Se)_4$). While beneficial, the soft anneal is not required. However, if the structure is not subjected to a soft annealing, most likely the other unwanted secondary phase for example $Cu_2(S/Se)$ $Cu_{2-X}(S/Se)$, $Sn(S/Se)_2$, $Sn_2(S/Se)_3$, $Cu_2Sn(S/Se)_3$, $Zn(S/Se)$, etc. may form along with single phase polycrystalline CZTS which eventually will have adverse effects on the efficiency of the cell.

Figure 5:
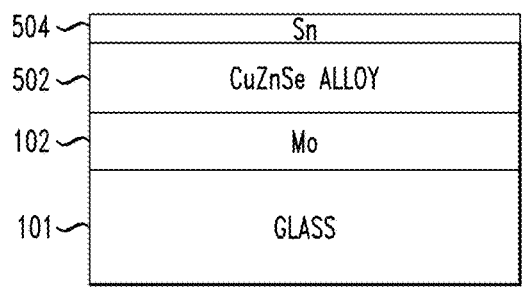
FIG. 5 is a cross-sectional diagram illustrating a metal-semiconductor alloy stack having been electrodeposited on the substrate according to an embodiment of the present invention.

As shown in FIG. 5, another way to fabricate the CZTS absorber layer is to electrodeposit a metal-semiconductor alloy stack on the substrate. This variation, however, involves an additional annealing step, i.e., in addition to the soft anneal and the final anneal, after the Se-containing layer is plated onto the stack. Specifically, a copper zinc selenium (Cu—Zn—Se) alloy layer 502 is electrodeposited on substrate 101 (i.e., on the backside electrode). According to an exemplary embodiment, Cu—Zn—Se alloy layer 502 is electrodeposited from a plating bath as described in U.S. patent application Ser. No. 12/878,811, entitled "Method and Chemistry for Selenium Electrodeposition" (hereinafter "U.S. patent application Ser. No. 12/878,811"), the contents of which are incorporated by reference herein. By way of example only, in U.S. patent application Ser. No. 12/878,811 a Se electroplating solution is prepared by forming the solution from a mixture having selenium oxide, an acid selected from the group consisting of alkane sulfonic acid, alkene sulfonic acid, aryl sulfonic acid, heterocyclic sulfonic acid, aromatic sulfonic acid and perchloric acid, and a solvent. The pH of the solution is adjusted to from about 2.0 to about 3.0. As described in U.S. patent application Ser. No. 12/878,811, the electroplating solution may further contain one or more additives such as one or more organic additives (e.g., thiourea or thiazine, or benzenesulfonic acid (BSA)), one or more metalloid halides (e.g., $BiCl_3$) and/or one or more sources of $Cl^-$ ions (KCl and/or NaCl). Thus, Cu—Zn—Se alloy layer 502 (and any of the other Se-containing films described herein that are plated from such a solution) can also contain one or more of these additives. By way of example only, Cu—Zn—Se alloy layer 502 may contain bismuth, i.e., $BiCl_3$, as an additive.

Following the deposition of Cu—Zn—Se alloy layer 502 the layer is annealed. As-plated Se is amorphous and resistive and thus requires this Se annealing step to make the layer crystalline and conductive. According to an exemplary embodiment, the Se anneal is conducted at a temperature of from about 80 degrees Celsius (° C.) to about 100° C., for a duration of from about 30 minutes to about 60 minutes. A Sn metal layer 504 is then electrodeposited onto Cu—Zn—Se alloy layer 502. The component layers of the metal-semiconductor alloy stack may be electrodeposited using a paddle cell, as described in detail below.

As will be described in detail below, the metal-semiconductor alloy stack will be (preferably) subjected to an intermediate/soft anneal which will help to form the Cu—Zn—Se—Sn alloy followed by a final anneal in a S environment (to produce CZTS in the form of $Cu_2ZnSn(S/Se)_4$). In this case, since Se is already plated in the stack, a Se environment during the final anneal is not needed. While beneficial, the soft anneal is not required. However, if the structure is not subjected to a soft annealing, most likely the other unwanted secondary phase for example $Cu_2(S/Se)$ $Cu_{2-X}(S/Se)$, $Sn(S/Se)_2$, $Sn_2(S/Se)_3$, $Cu_2Sn(S/Se)_3$, $Zn(S/Se)$, etc. may form along with single phase polycrystalline CZTS which eventually will have adverse effects on the efficiency of the cell.

Figure 6:
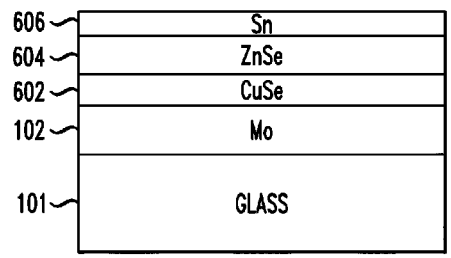
FIG. 6 is a cross-sectional diagram illustrating another exemplary embodiment wherein a metal-semiconductor alloy stack has been electrodeposited on the substrate according to an embodiment of the present invention.

Another method that involves electrodepositing metal-semiconductor alloy stack on the substrate is shown in FIG. 6. This variation, however, involves an additional annealing step, i.e., in addition to the soft anneal and the final anneal, after each Se-containing layer is plated onto the stack. Specifically, a copper selenium (Cu—Se) layer 602 is electrodeposited on substrate 101 (i.e., on the backside electrode). Techniques for preparing a Se plating bath, for example for plating a Cu—Se film, are described in U.S. patent application Ser. No. 12/878,811. Following the deposition of Cu—Se layer 602 the layer is annealed. According to an exemplary embodiment, the Se anneal is conducted at a temperature of from about 80° C. to about 100° C., for a duration of from about 30 minutes to about 60 minutes.

Following the Se anneal, a zinc selenium (Zn—Se) layer 604 is electrodeposited on Cu—Se layer 602. Techniques for preparing a plating bath, for example for plating a Zn—Se film, are described in U.S. patent application Ser. No. 12/878,787 and in U.S. patent application Ser. No. 12/878,811. After the deposition of Zn—Se layer 604, the layer is annealed (a second Se annealing), for example, at a temperature of from about 80° C. to about 100° C., for a duration of from about 30 minutes to about 60 minutes. Alternatively, if the Cu—Se and Zn—Se layers are plated from a bath having a temperature of above 60° C. then these intermediate annealing steps can be avoided. A Sn metal layer 606 is then electrodeposited on Zn—Se layer 604. The component layers of the metal-semiconductor alloy stack may be electrodeposited using a paddle cell, as described in detail below.

As will be described in detail below, the metal-semiconductor alloy stack will also be (preferably) subjected to an intermediate/soft anneal which will help to form the Cu—Se and Zn—Se alloy followed by a final anneal in a S environment (to produce CZTS in the form of $Cu_2ZnSn(S/Se)_4$). In this case, since Se is already plated in the stack, an Se environment during the final anneal is not needed. While beneficial, the soft anneal is not required. However, if the structure is not subjected to a soft annealing, most likely the other unwanted secondary phase for example $Cu_2(S/Se)$ $Cu_{2-x}(S/Se)$, $Sn(S/Se)_2$, $Sn_2(S/Se)_3$, $Cu_2Sn(S/Se)_3$, $Zn(S/Se)$, etc. may form along with single phase polycrystalline CZTS which eventually will have adverse effects on the efficiency of the cell.

Figure 7:
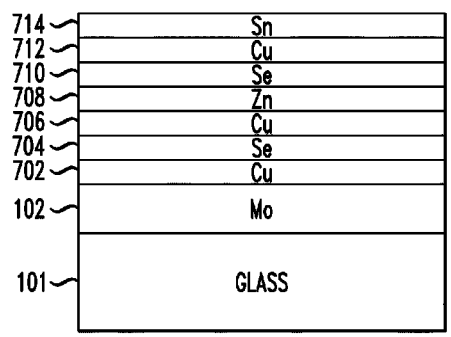
FIG. 7 is a cross-sectional diagram illustrating a metal-semiconductor stack having been electrodeposited on the substrate according to an embodiment of the present invention.

As shown in FIG. 7, yet another way to fabricate the CZTS absorber layer is to electrodeposit a metal-semiconductor stack on the substrate. Like with the embodiment shown in FIGS. 5 and 6, an additional annealing step is involved, i.e., in addition to the soft anneal and the final anneal, after each Se-containing layer is plated onto the stack. Specifically, a first Cu metal layer 702 is electrodeposited on substrate 101 (i.e., on the backside electrode). Next, a first Se semiconductor layer 704 is electrodeposited on Cu metal layer 702. Techniques for preparing an Se plating bath, for example for plating a Se layer, are described in U.S. patent application Ser. No. 12/878,811. Following the deposition of Se semiconductor layer 704 the layer is annealed. This Se annealing step gives a homogenous surface morphology. According to an exemplary embodiment, the Se anneal is conducted at a temperature of from about 80° C. to about 100° C., for a duration of from about 30 minutes to about 60 minutes.

Following the Se anneal, a second Cu metal layer 706 is electrodeposited on Se semiconductor layer 704. A Zn metal layer 708 is electrodeposited on Cu metal layer 706. A second Se semiconductor layer 710 is electrodeposited on Zn metal layer 708. Following the deposition of Se semiconductor layer 710 the layer is annealed (a second Se annealing), for example, at a temperature of from about 80° C. to about 100° C., for a duration of from about 30 minutes to about 60 minutes.

Following the second Se anneal, a third Cu metal layer 712 is electrodeposited on Se semiconductor layer 710. A Sn metal layer 714 is then electrodeposited on Cu metal layer 712. The component layers of the metal-semiconductor stack may be electrodeposited using a paddle cell, as described in detail below.

As will be described in detail below, the metal-semiconductor stack will also be (preferably) subjected to an intermediate/soft anneal which will help to form the Cu—Zn—Sn—Se alloy followed by a final anneal in a S environment (to produce CZTS in the form of $Cu_2ZnSn(S/Se)_4$). In this case, since Se is already plated in the stack, an Se environment during the final anneal is not needed. While beneficial, the soft anneal is not required. However, if the structure is not subjected to a soft annealing, most likely the other unwanted secondary phase for example $Cu_2(S/Se)$ $Cu_{2-x}(S/Se)$, $Sn(S/Se)_2$, $Sn_2(S/Se)_3$, $Cu_2Sn(S/Se)_3$, $Zn(S/Se)$, etc. may form along with single phase polycrystalline CZTS which eventually will have adverse effects on the efficiency of the cell.

The thickness of each of the layers in the metal stack, alloy stack, metal-semiconductor alloy stack or metal-semiconductor stack is directly proportional to an amount of the element(s) in that layer with regard to an amount of that element(s) in the completed CZTS absorber layer (see below). Using the metal stack embodiment shown in FIG. 2 as an example, the thickness of Cu metal layer 202 will dictate the final amount of Cu in the CZTS absorber layer. The same is true for Zn metal layer 204 and Sn metal layer 206 (as well as for all of the different stack configurations). Thus, while in FIG. 2, for example, all of the metal layers are shown to be of the same thickness, this is done merely for ease of depiction. In reality the metal layers would likely have different thicknesses to reflect the different relative compositions of elements. According to an exemplary embodiment, the following compositional ratios of elements are employed. The compositional ratio of Cu to Sn (Cu/Sn) in the CZTS absorber layer is from about 1.5 to about 2.2, e.g., about 1.8. The compositional ratio of Zn to Sn (Zn/Sn) in the CZTS absorber layer is from about 1.2 to about 1.4, e.g., about 1.3. The compositional ratio of Cu to Zn and Sn (Cu/(Zn+Sn)) in the CZTS absorber layer is from about 0.5 to about 0.95, e.g., about 0.7. The compositional ratio of Se (when Se is included in the stack) to Cu, Zn and Sn (Se/(Cu+Zn+Sn)) in the CZTS absorber layer is from about 0.95 to about 1.02. The roughness of the film is below 10 nm and the uniformity of the film is less than 5 percent (%), e.g., from about 1.5% to about 3%.

After the metal stack, alloy stack, metal-semiconductor alloy stack or metal-semiconductor stack is formed as shown in FIGS. 2-7, an intermediate/soft anneal is performed to help form the respective alloy. According to an exemplary embodiment, the soft anneal is performed in two-steps (e.g., at a temperature of from about 160° C. to about 180° C. for a duration of from about 300 seconds to about 600 seconds, followed by a ramp up to a temperature of from about 270° C. to about 400° C., for a duration of from about 900 seconds to about 1,800 seconds (see, FIG. 15, described below)). This annealing procedure is performed in this two-step manner to prevent balling up of the Sn. As highlighted above, while beneficial, the soft anneal is not required. However, if the structure is not subjected to a soft annealing, most likely the other unwanted secondary phase for example $Cu_2(S/Se)$ $Cu_{2-x}(S/Se)$, $Sn(S/Se)_2$, $Sn_2(S/Se)_3$, $Cu_2Sn(S/Se)_3$, $Zn(S/Se)$, etc. may form along with single phase polycrystalline CZTS which eventually will have adverse effects on the efficiency of the cell.

Figure 8:
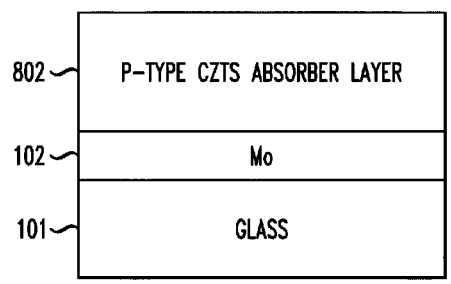
FIG. 8 is a cross-sectional diagram illustrating a $Cu_2ZnSnS_4$ or $Cu_2ZnSn(S/Se)_4$ (CZTS) absorber layer having been formed on the substrate according to an embodiment of the present invention.

The structure is then subjected to a final anneal in a S or S/Se environment to form p-type CZTS layer absorber layer 802 on the substrate, as shown in FIG. 8. Suitable S and Se sources include, but are not limited to, hydrogen sulfide ($H_2S$) and hydrogen selenide ($H_2Se$), respectively. The composition of CZTS layer absorber layer 802, i.e., either $Cu_2ZnSnS_4$ or $Cu_2ZnSn(S/Se)_4$, depends on the composition of the stack and/or on the final anneal environment. For example, in the embodiments where the stack does not contain plated Se, i.e., the embodiments shown in FIGS. 2-4, the final anneal in a S environment will produce CZTS layer absorber layer 802 in the form of $Cu_2ZnSnS_4$, whereas the final anneal in a S/Se environment will produce CZTS layer absorber layer 802 in the form of $Cu_2ZnSn(S/Se)_4$. The efficiency of the cell is greater with $Cu_2ZnSn(S/Se)_4$ as opposed to $Cu_2ZnSnS_4$, e.g., from about 1% to about 2% greater. In the embodiment where the stacks contain plated Se, the embodiments shown in FIGS. 5-7, an Se environment for the final anneal is not needed as sulfurization (in an S environment) will produce CZTS absorber layer 802 in the form of $Cu_2ZnSn(S/Se)_4$. According to an exemplary embodiment, the final anneal is performed at a temperature of from about 300° C. to about 550° C., for a duration of from about 1 minute to about 60 minutes (depending on the conditions, e.g., from about 2 minutes to about 3 minutes). As will be described in detail below, the CZTS absorber component layers can be electroplated using a paddle cell which advantageously permits plating of the component layers, and resulting CZTS absorber layer having a uniformity of thickness that is within 5% of an average thickness across the entire area of the layer (see below).

Figure 9:
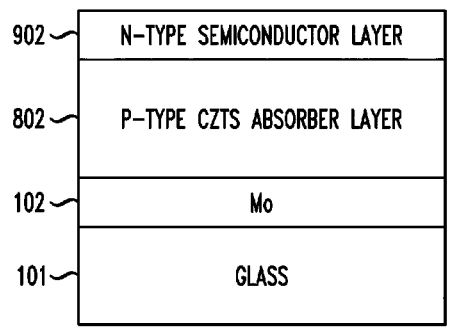
FIG. 9 is a cross-sectional diagram illustrating an n-type semiconductor layer having been formed on the CZTS absorber layer according to an embodiment of the present invention.

As shown in FIG. 9, an n-type semiconductor layer 902 is then formed on CZTS absorber layer 802. According to an exemplary embodiment, semiconductor layer 902 includes a semiconductor material such as cadmium sulfide (CdS) or zinc sulfide (ZnS) deposited using PVD. n-type semiconductor layer 902 will form a p-n diode junction with CZTS absorber layer 802.

Figure 10:
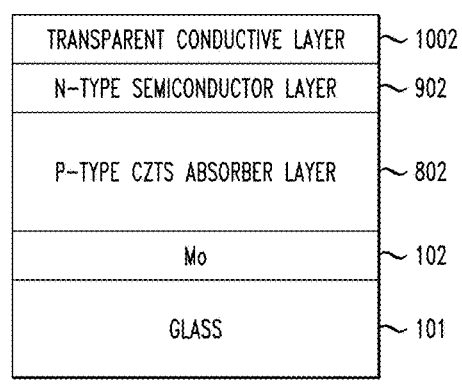
FIG. 10 is a cross-sectional diagram illustrating a transparent conductive layer having been formed on the n-type semiconductor layer according to an embodiment of the present invention.

As shown in FIG. 10, a transparent conductive layer 1002 is then formed on n-type semiconductor layer 902. According to an exemplary embodiment, transparent conductive layer 1002 includes aluminum (Al) or n-doped zinc oxide (ZnO) or indium-tin-oxide (ITO) and intrinsic ZnO and is deposited by PVD. Transparent conductive layer 1002 will serve as a top electrode of the device.

The diode may be further processed. For example, the diode may be cut into two or more substructures and/or contacts may be added. See, for example, the description of FIG. 24, below.

Figure 11:
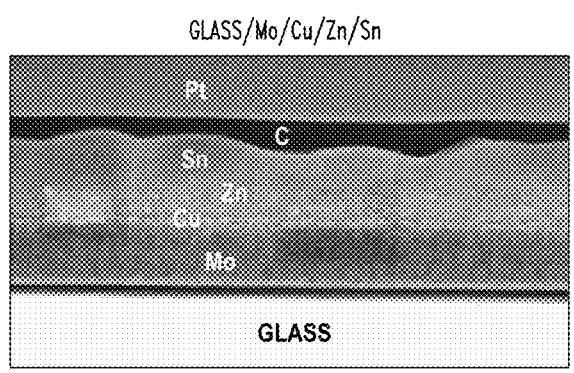
FIG. 11 is an image of the metal stack configuration shown illustrated in FIG. 2 according to an embodiment of the present invention.

FIG. 11 is an image 1100 of the metal stack configuration shown illustrated in FIG. 2. This stack configuration will provide low porosity in the Mo/Cu boundary. If the Zn or Sn metal layers were instead put next to the Mo layer voids would be generated at the Mo-CZTS absorber layer interface due to the relatively faster diffusion rate of Zn and/or Sn as compared to Cu. As a result, the total contact area of the back contact metal (i.e., Mo) to the CZTS absorber layer would decrease and hence impact negatively on the device efficiency. The carbon (C) and platinum (Pt) layers shown in image 1100 are present only to prepare the sample for analysis.

Figure 12:
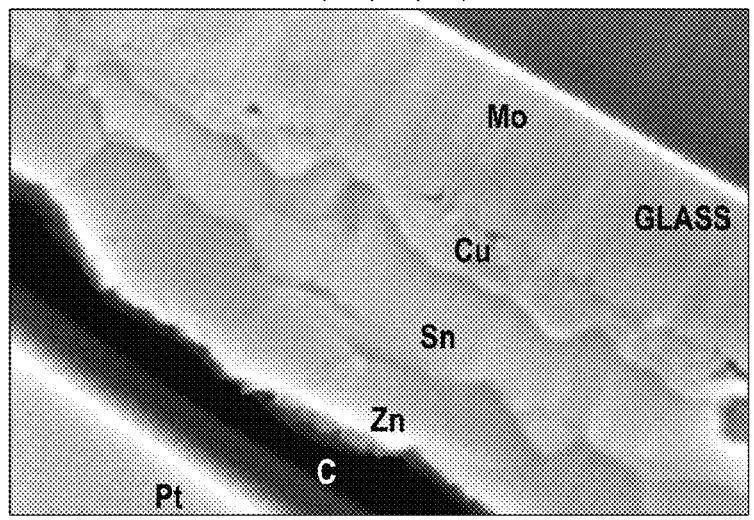
FIG. 12 is an image of the metal stack configuration shown illustrated in FIG. 2 with the order of metal layers switched according to an embodiment of the present invention.

FIG. 12 is an image 1200 of the metal stack configuration shown illustrated in FIG. 2 with the variation of switching the order of the Zn and Sn metal layers. However, the Cu metal layer is still on top of the back contact metal (i.e., Mo). As with the configuration depicted in FIG. 11, this stack configuration will provide low porosity in the Mo/Cu boundary. The C and Pt layers shown in image 1200 are present only to prepare the sample for analysis.

Figure 13:
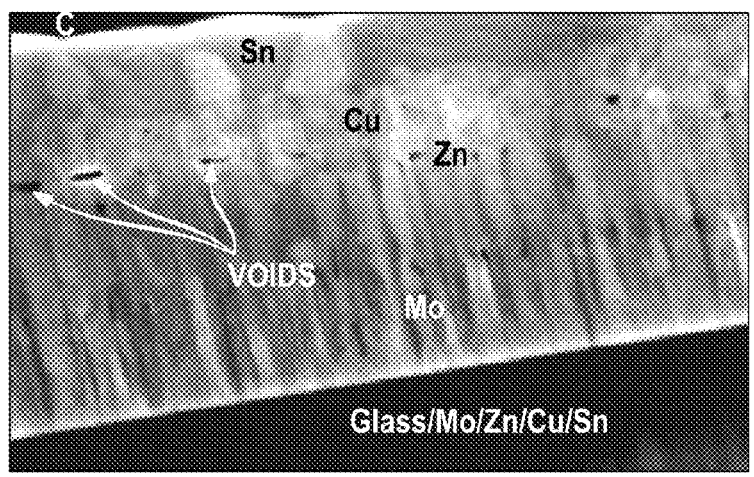
FIG. 13 is an image illustrating how voids can occur if the first metal layer in the stack is not copper (Cu) according to an embodiment of the present invention.

FIG. 13 is an image 1300 illustrating how voids can occur if the first metal layer in the stack is not Cu. As highlighted above, Cu should be placed on top of the back contact metal to prevent this void formation. In the example shown in FIG. 13 Zn, instead of Cu, is placed at the boundary with the back contact metal (i.e., Mo). The undesirable result is void formation. The same result would likely occur if Sn, instead of Cu, is placed at the boundary with the back contact metal (i.e., Mo). The voids are probably created due to the kirkendall effect.

Figure 14:
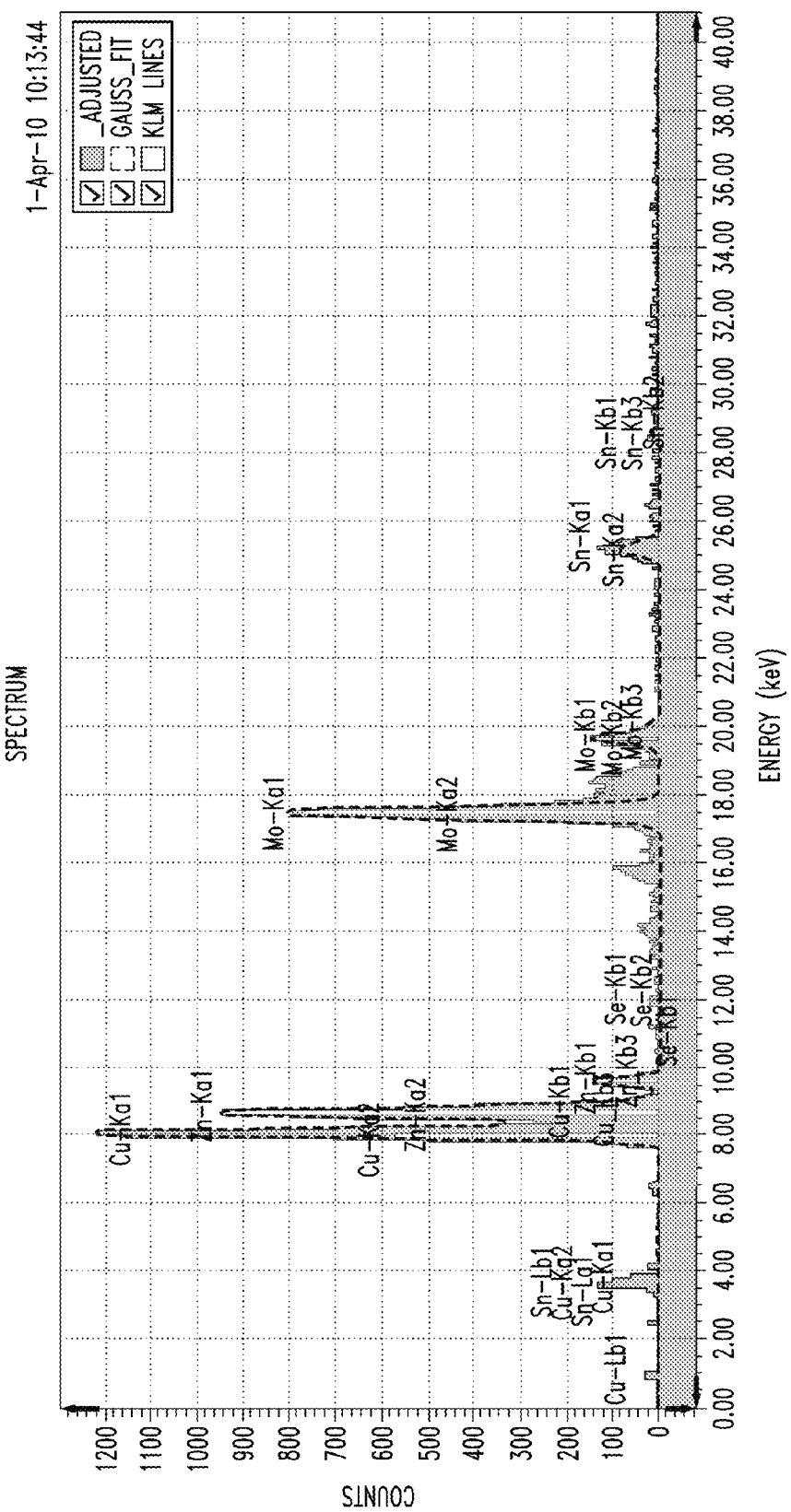
FIG. 14 is an x-ray fluorescence plot after plating the metal stack of FIG. 2 according to an embodiment of the present invention.

FIG. 14 is an x-ray fluorescence plot 1400 after plating the metal stack of FIG. 2. Plot 1400 shows the spectrum of Cu, Zn, Mo and Sn. In plot 1400, energy (measured in kiloelectron volts (keV) is plotted on the x-axis and counts are plotted on the y-axis. Plot 1400 shows Cu—Sn—Mo and Sn peaks with respect to their energy.

Figure 15:
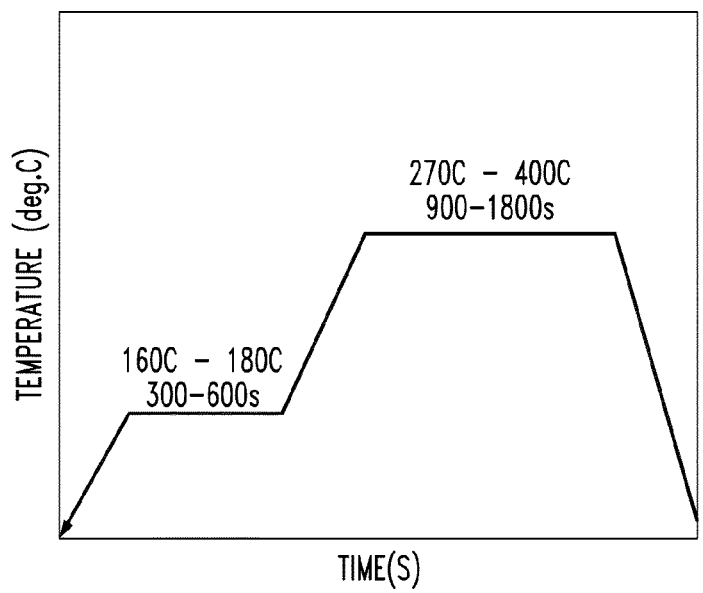
FIG. 15 is a graph illustrating a two-step soft annealing process according to an embodiment of the present invention.

As highlighted above, after the metal stack, alloy stack, metal-semiconductor alloy stack or metal-semiconductor stack is formed, an intermediate/soft anneal is (optionally) performed to help form the respective alloy. This annealing procedure is performed in a two-step manner to prevent balling up of the Sn. FIG. 15 is a graph 1500 illustrating this two-step soft annealing process. In graph 1500, time (measured in seconds (s)) is plotted on the x-axis and temperature (measured in ° C. (deg. C)) is plotted on the y-axis. As shown in graph 1500, an anneal is first performed at a temperature of from about 160° C. to about 180° C. (e.g., about 180° C.) for a duration of from about 300 seconds to about 600 seconds. The temperature is then ramped up to from about 270° C. to about 400° C. (e.g., about 400° C.), for a duration of from about 900 seconds to about 1,800 seconds.

Figure 16:
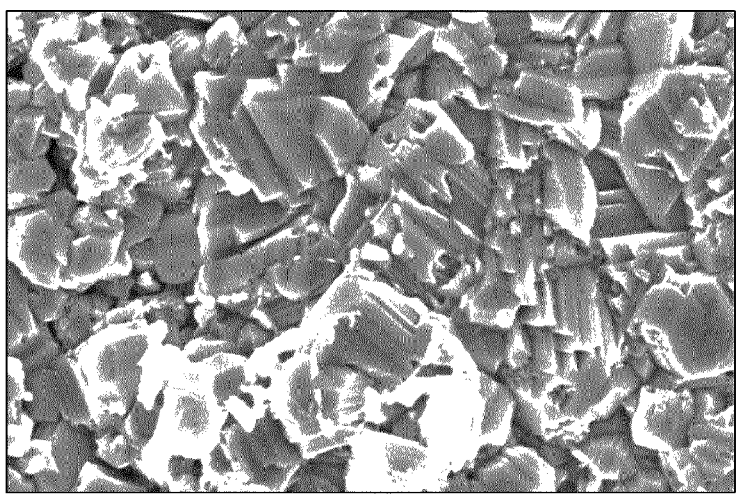
FIG. 16 is a top-down image of the metal stack of FIG. 2 after sulfurization according to an embodiment of the present invention.
Figure 17:
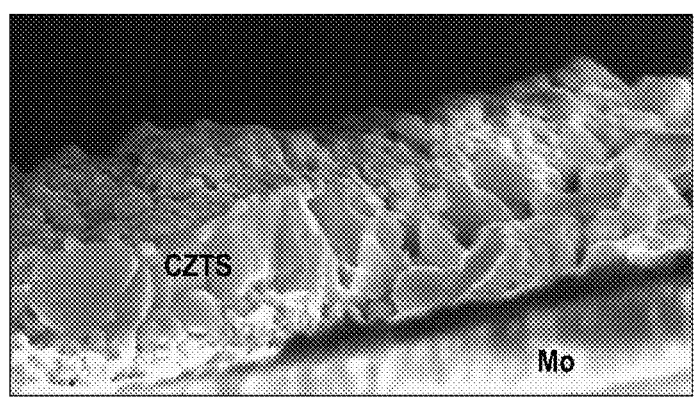
FIG. 17 is a cross-sectional image of the metal stack of FIG. 2 after sulfurization according to an embodiment of the present invention.

FIG. 16 is a top-down image 1600 of the metal stack of FIG. 2 after sulfurization. As highlighted above, the sulfurization process involves a final anneal in a S or an S/Se environment to form the CZTS absorber layer. Image 1600 illustrates the surface morphology of the CZTS absorber layer. FIG. 17 is a cross-sectional image 1700 of the metal stack of FIG. 2 after sulfurization.

Figure 18:
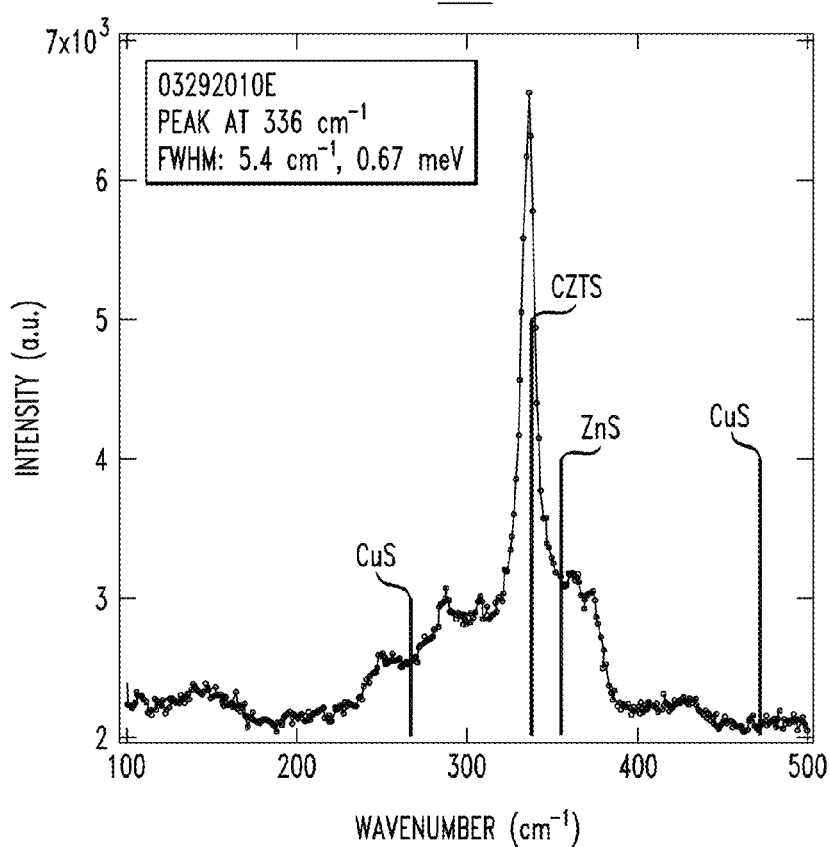
FIG. 18 is a Raman Spectroscopy plot illustrating the formation of CZTS after sulfurization of the metal stack of FIG. 2 according to an embodiment of the present invention.

FIG. 18 is a Raman Spectroscopy plot 1800 illustrating the formation of CZTS after sulfurization of the metal stack of FIG. 2. In plot 1800, wavenumber (measured in inverse centimeters ($cm^{-1}$)) is plotted on the x-axis and intensity (measured in arbitrary units (a.u.)) is plotted on the y-axis.

Figure 19:
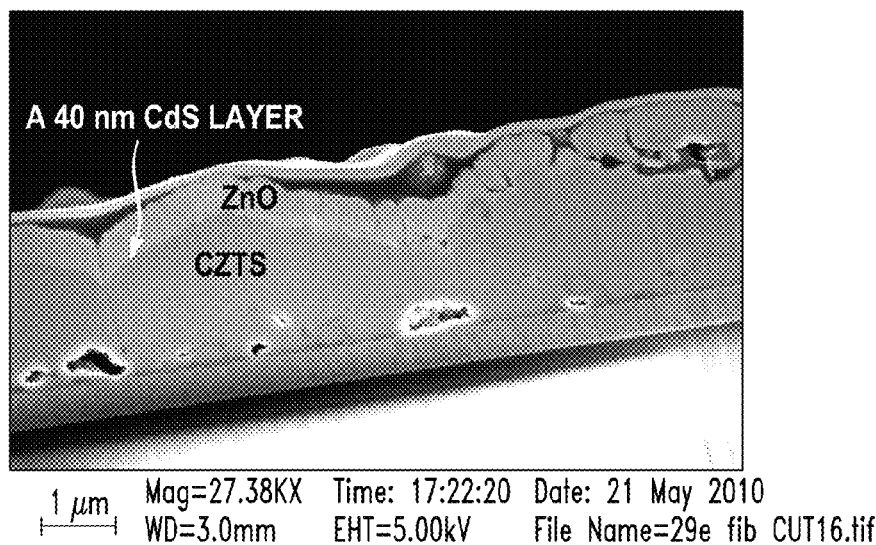
FIG. 19 is an image of a completed device structure formed using the present techniques according to an embodiment of the present invention.

FIG. 19 is an image 1900 of a completed device structure formed using the present techniques. Image 1900 shows that next to the Mo is an absorber layer (p-type), then a 40 nm CdS (n-type) layer and on top a ZnO layer.

Figure 20:
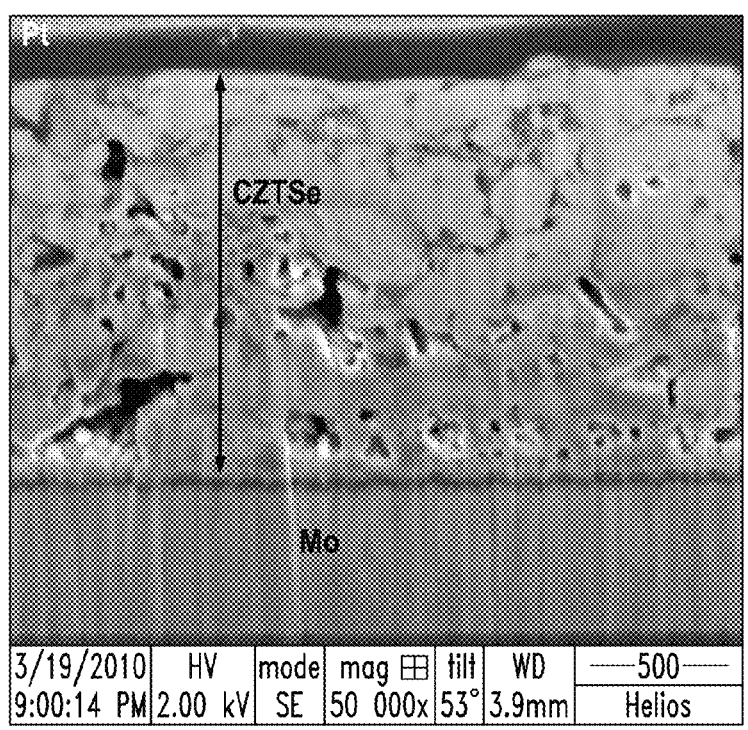
FIG. 20 is an image of the metal-semiconductor stack of FIG. 7 after sulfurization according to an embodiment of the present invention.
Figure 21:
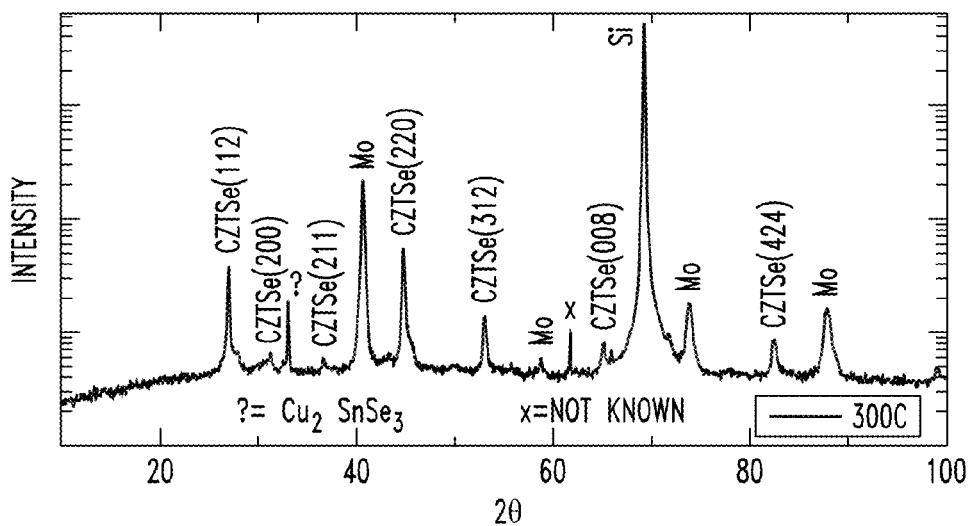
FIG. 21 is an x-ray diffraction (XRD) spectrum of the structure of FIG. 20 according to an embodiment of the present invention.

FIG. 20 is an image 2000 of the metal-semiconductor stack of FIG. 7 after sulfurization. In this example, an anneal was performed after the deposition of each Se layer in the stack. This Se annealing step is described in detail above. FIG. 21 is an x-ray diffraction (XRD) spectrum 2100 of the structure of FIG. 20. In XRD spectrum 2100, beam angle (2θ) is plotted on the x-axis and intensity is plotted on the y-axis.

According to an exemplary embodiment, the CZTS component metal, alloy and semiconductor layers shown in FIGS. 2-7 are electrodeposited in a paddle cell. Use of a paddle cell provides for uniform thin film deposition on large area devices (i.e., devices having a surface area greater than 700 square centimeters). Suitable paddle cells for use in conjunction with the present techniques are described, for example, in U.S. Pat. No. 5,516,412 issued to Andricacos et al., entitled "Vertical Paddle Plating Cell" (hereinafter "Andricacos '412") and in U.S. Pat. No. 5,312,532 issued to Andricacos et al., entitled "Multi-Compartment Electroplating System" (hereinafter "Andricacos '532") the contents of each of the foregoing of which are incorporated by reference herein.

Figure 22:
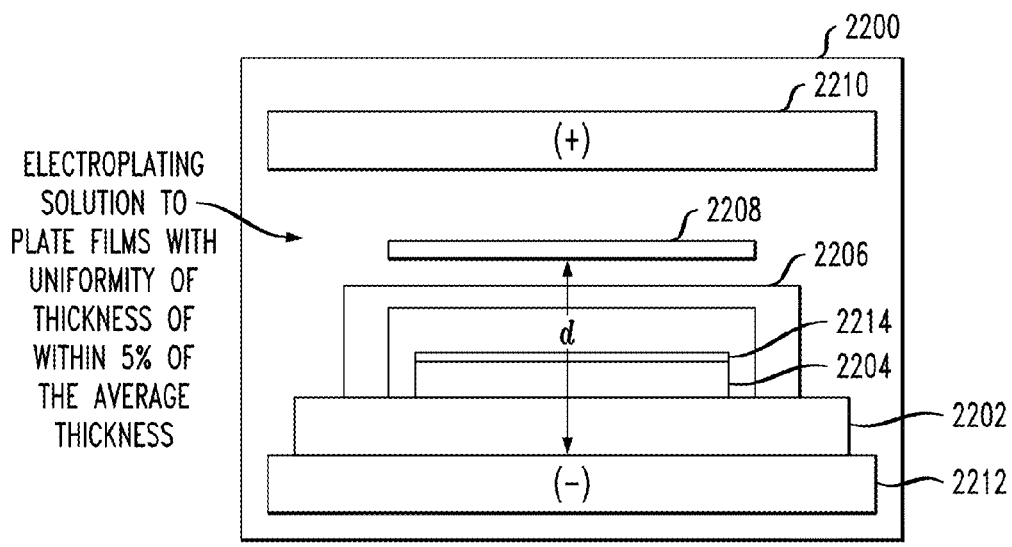
FIG. 22 is a schematic diagram illustrating an exemplary paddle electroplating cell according to an embodiment of the present invention.

FIG. 22 is a schematic diagram illustrating exemplary paddle electroplating cell 2200 that can be employed for uniform thin film deposition of the present CZTS component metal, alloy and semiconductor layers (from FIGS. 2-7) on large area devices (i.e., devices having a surface area greater than 700 square centimeters). For a detailed description of paddle cells and the components and functioning thereof, see Andricacos '412 and Andricacos '532. Paddle cell 2200 includes a holder 2202 (i.e., for mounting a substrate 2204 (such as substrate 101 with backside electrode 102 formed thereon, see description of FIG. 1, above), a thief element 2206 that borders at least two sides of substrate 2204, a paddle 2208 for agitating the electroplating solution and a cell (anode) electrode 2210.

Holder 2202 can have a holder (cathode) electrode 2212 attached thereto. Alternatively, thief element 2206 can be made of a suitable metal to itself serve as the cathode electrode of the cell (see, for example, Andricacos '412). Substrate 2204 in this example includes a glass substrate having a backside electrode 2214 thereon (such as substrate 101 with backside electrode 102 formed thereon, see description of FIG. 1, above). According to an exemplary embodiment, backside electrode 2214 includes Mo, molybdenum copper (MoCu), molybdenum alloy or a double layer with Mo as the first layer and a conductive second layer, such as Cu and Zn.

Paddle 2208 can include a pair of vertically elongate, triangular prisms (see, for example, Andricacos '412). In the exemplary embodiment shown in FIG. 22, paddle 2208 is situated at a distance d from holder electrode 2212. According to an exemplary embodiment, d is from about 1 millimeter (mm) to about 5 mm. During plating, the paddle moves back and forth parallel to the surface of the substrate (or backside electrode coated surface of the substrate) to agitate the electroplating solution. According to an exemplary embodiment, the paddle moves back and forth at a frequency of from about 0.3 hertz (Hz) to about 1.8 Hz. In the depiction shown in FIG. 22, the paddle would move into and out of the page. If cell 2200 is a vertical cell, as in Andricacos '412, then FIG. 22 would depict what would be seen when one looks down into the cell.

Figure 23:
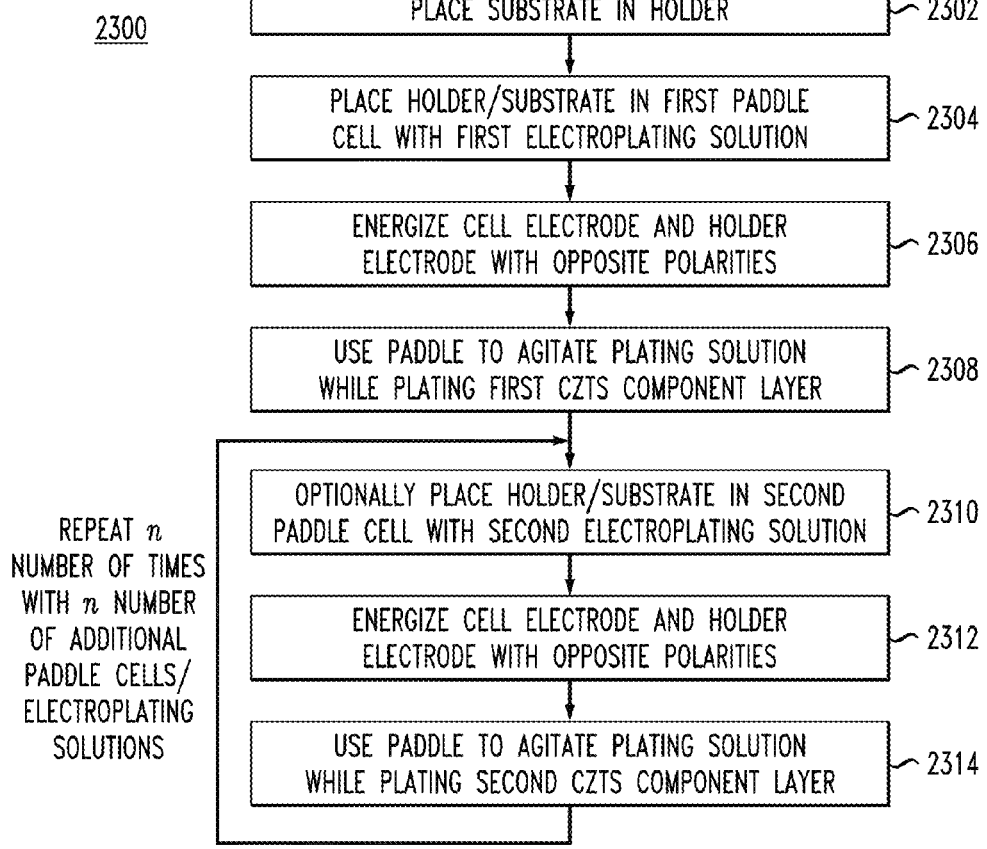
FIG. 23 is a diagram illustrating an exemplary methodology for electrodepositing CZTS component metal, alloy and semiconductor layers using a paddle electroplating cell according to an embodiment of the present invention.

FIG. 23 is a diagram illustrating exemplary methodology 2300 for electrodepositing CZTS component metal, alloy and semiconductor layers (such as those shown in FIGS. 2-7) using a paddle electroplating cell, such as paddle electroplating cell 2200 (of FIG. 22). In step 2302, a substrate (e.g., substrate 2204) is mounted in a holder (e.g., holder 2202). As described in conjunction with the description of FIG. 22, above, the cell has a thief element (e.g., thief element 2206) that borders at least two sides of the substrate. The holder also has a holder electrode (e.g., holder electrode 2212). The substrate in this example is, as described above, coated with a backside electrode (containing Mo, MoCu, a molybdenum alloy or a double layer with Mo as the first layer and a conductive second layer, such as Cu and Zn).

This process will involve placing the holder (and its associated components)/substrate into a plurality of different plating solutions. According to an exemplary embodiment, a multi-compartment electroplating system, such as that described in Andricacos '532 may be employed in this manner. In general, however, each component layer will be plated from a different paddle cell containing a different plating solution, and the holder/substrate can be moved from one cell to another (with a rinse inbetween). The paddle cells can all be configured the same as one another (and only the electroplating solution therein varies), e.g., all the paddle cells are the same as paddle electroplating cell 2200, or alternatively the paddle cells can vary.

In step 2304, the holder with the substrate is placed into a first paddle electroplating cell (such as paddle electroplating cell 2200) opposite the cell electrode. The first paddle electroplating cell contains a first electroplating solution. As highlighted above, it is important in forming the CZTS absorber layer that the Cu metal (or alloy) layer be the first deposited on the substrate, otherwise voids will likely form. Therefore, the first electroplating solution is a Cu-containing solution.

In step 2306, the holder electrode (e.g., holder electrode 2212) and the cell electrode (e.g., cell electrode 2210) are energized with opposite polarities, while maintaining the current density in the thief at a first thief current density and the current density in the backside electrode at a backside current density. According to an exemplary embodiment, the first thief current density is from about 0.5 milliamps per square centimeter ($mA/cm^2$) to about 100 $mA/cm^2$, and the backside current density is from about 0.5 $mA/cm^2$ to about 100 $mA/cm^2$.

In step 2308, the paddle (e.g., paddle 2208) is moved repeatedly back and forth through the first electroplating solution (e.g., at a frequency of from about 0.3 Hz to about 1.8 Hz) over the surface of the backside electrode at a first paddle distance d (e.g., of from about 1 mm to about 5 mm from the backside electrode) while a first CZTS component layer is electroplated on the substrate (e.g., on the backside electrode). The layer produced in this manner will have a uniformity of thickness that is within 5% of an average thickness across an entire area of the layer. In other words, the thickness in any part of the layer deviates no more than 5% from the average thickness of the layer.

If the first electroplating solution contained Cu, Zn and Sn, then the plating process could be considered complete at this point since a CZTS absorber layer could be formed from the plated film. However, as highlighted above, several embodiments involve plating one or more additional layers to complete the CZTS fabrication process.

To plate additional layers, the holder with the substrate and first plated layer is removed from the first paddle cell, rinsed (e.g., one or more times with water), and in step 2310, the holder with the substrate is placed into a second paddle electroplating cell opposite the cell electrode of the second paddle electroplating cell. According to an exemplary embodiment, the second paddle electroplating cell is identical to the first paddle electroplating cell. The only difference is the electroplating solution employed. Namely, the second paddle electroplating cell contains a second electroplating solution. By way of example only, if the process is being used to form the metal stack of FIG. 2, then first electroplating solution would contain Cu and the second electroplating solution would contain Zn. To form the alloy stack of FIG. 3, the first electroplating solution would contain Cu and Zn and the second electroplating solution would contain Cu and Sn, and so on.

In step 2312, the holder electrode and the cell electrode of the second paddle electroplating cell are energized with opposite polarities, while maintaining the current density in the thief at a second thief current density and the current density in the backside electrode at a backside current density. According to an exemplary embodiment, the second thief current density is from about 0.5 $mA/cm^2$ to about 100 $mA/cm^2$, and the backside current density is from about 0.5 $mA/cm^2$ to about 100 $mA/cm^2$, which are the same parameters used to form the first layer.

In step 2314, the paddle of the second paddle electroplating cell is moved repeatedly back and forth through the second electroplating solution (e.g., at a frequency of from about 0.3 Hz to about 1.8 Hz) over the surface of the backside electrode at a second paddle distance d (e.g., of from about 1 mm to about 5 mm from the backside electrode) (which again are the same parameters used to form the first component layer) while a second CZTS component layer is electroplated on the substrate (e.g., on the first component layer). The layer produced in this manner will have a uniformity of thickness that is within 5% of an average thickness across an entire area of the layer. In other words, the thickness in any part of the layer deviates no more than 5% from the average thickness of the layer.

Steps 2310-2314 can be repeated n number of times to plate n additional layers, each time using a different paddle electroplating cell and a different electroplating solution. Using the example above, if the process is being used to form the metal stack of FIG. 2, one more additional layer would be plated from a third electroplating solution, wherein the first electroplating solution would contain Cu, the second electroplating solution would contain Zn and the third electroplating solution would contain Sn. A rinse (e.g., with water) is employed in between each round of plating. At the end of the process, the parts are dried and kept, for example, in a nitrogen box and/or further processing steps (e.g., sulfurization) are performed.

Figure 24:
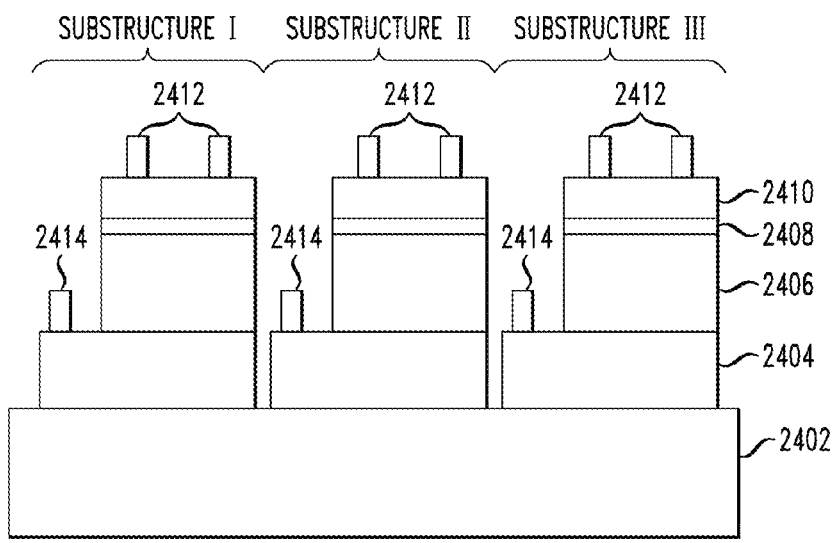
FIG. 24 is a cross-sectional diagram illustrating an exemplary diode divided into a plurality of substructures according to an embodiment of the present invention.

FIG. 24 is a cross-sectional diagram illustrating an exemplary diode, e.g., solar cell, 2400 divided into a plurality of substructures. Like the device shown, for example, in FIG. 10 (described above), diode 2400 includes a (glass, metal, metal foil, stainless steel or Cu foil) substrate 2402, a backside electrode 2404, such as Mo, on substrate 2402, a p-type CZTS absorber layer 2406 on a side of backside electrode 2404 opposite substrate 2402, an n-type semiconductor (buffer) layer 2408 (e.g., CdS) on a side of CZTS absorber layer 2406 opposite backside electrode 2404 and a transparent conductive layer 2410 (e.g., Al or n-doped ZnO or ITO/intrinsic ZnO) on a side of n-type semiconductor layer 2408 opposite CZTS absorber layer 2406.

A metal grid electrode 2412 is then deposited on transparent conductive layer 2410. Metal grid electrode 2412 can be formed from any suitable metal(s), such as nickel (Ni) and/or Al. The diode is then divided into a number of substructures. According to an exemplary embodiment, the diode substructures are cut with a laser or mechanical scriber. Contacts 2414 are then formed to backside electrode 2404 using conventional techniques. Contacts 2414, along with metal grid electrode 2412 will allow for measurement of the diode.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for fabricating a diode, comprising the steps of:
providing a substrate;
forming a backside electrode on the substrate;
electrodepositing one or more layers on the backside electrode, wherein at least one of the layers comprises copper, at least one of the layers comprises zinc and at least one of the layers comprises tin, by the steps of: electrodepositing a first copper metal layer on the backside electrode; electrodepositing a first selenium semiconductor layer on the first copper metal layer; annealing the first selenium semiconductor layer at a temperature of from about 80° C. to about 100° C., for a duration of from about 30 minutes to about 60 minutes; electrodepositing a second copper metal layer on the first selenium semiconductor layer; electrodepositing a zinc metal layer on the second copper metal layer; electrodepositing a second selenium semiconductor layer on the zinc metal layer; annealing the second selenium semiconductor layer at a temperature of from about 80° C. to about 100° C., for a duration of from about 30 minutes to about 60 minutes; electrodepositing a third copper metal layer on the second selenium semiconductor layer; and electrodepositing a tin metal layer on the third copper metal layer;
annealing the layers in an environment containing a sulfur source to form a p-type CZTS absorber layer on the backside electrode;
forming an n-type semiconductor layer on the CZTS absorber layer; and
forming a transparent conductive layer on the n-type semiconductor layer.

2. The method of claim 1, further comprising the step of:
performing a soft anneal of the layers by the steps of:
annealing the layers at a first temperature of from about 160° C. to about 180° C. for a duration of from about 300 seconds to about 600 seconds; and
annealing the layers at a second temperature of from about 270° C. to about 400° C. for a duration of from about 900 seconds to about 1,800 seconds.

3. The method of claim 1, wherein the substrate comprises glass, metal, metal foil, stainless steel or copper foil.

4. The method of claim 1, wherein the backside electrode comprises molybdenum, copper or titanium.

5. The method of claim 1, wherein a given one of the layers adjacent to the backside electrode comprises copper.

6. The method of claim 1, wherein the step of annealing the layers in the environment containing the sulfur source is performed at a temperature of from about 300° C. to about 550° C., for a duration of from about 1 minute to about 60 minutes.

7. The method of claim 1, wherein the n-type semiconductor layer comprises one or more of cadmium sulfide and zinc sulfide.

8. The method of claim 1, wherein the transparent conductive layer comprises zinc oxide.

9. The method of claim 1, wherein the step of electrodepositing the one or more layers on the backside electrode comprises the steps of:
mounting the substrate in a holder, the holder having a holder electrode attached thereto;
providing a paddle electroplating cell containing an electroplating solution, the paddle electroplating cell having a thief element, a paddle configured to agitate the electroplating solution and a cell electrode;
placing the substrate and holder in the paddle electroplating cell opposite the cell electrode such that the thief element borders at least two sides of the substrate;
energizing the holder electrode and the cell electrode with opposite polarities while maintaining a current density in the thief element at a current density of from about 0.5 mA/cm$^2$ to about 100 mA/cm$^2$ and a current density in the backside electrode at a current density of from about 0.5 mA/cm$^2$ to about 100 mA/cm$^2$;
moving the paddle repeatedly back and forth through the electroplating solution at a frequency of from about 0.3 Hz to about 1.8 Hz over a surface of the backside electrode while electroplating one of the layers having a uniformity of thickness that is within 5 percent of an average thickness across an entire area of the layer;
removing the substrate and holder from the paddle electroplating cell; and
rinsing the substrate and holder.

10. The method of claim 9, further comprising the steps of:
repeating the providing, placing, energizing, moving, removing and rinsing steps with n number of paddle electroplating cells and n number of electroplating solutions.

11. The method of claim 10, wherein the providing, placing, energizing, moving, removing and rinsing steps are performed with three paddle electroplating cells and three electroplating solutions, wherein the electroplating solutions include a first electroplating solution comprising copper, a second electroplating solution comprising zinc and a third electroplating solution comprising tin.

\* \* \* \* \*